United States Patent [19]

Keeling et al.

[11] 4,170,507
[45] Oct. 9, 1979

[54] METHOD FOR ENCAPSULATING A SOLAR CELL ARRAY

[75] Inventors: Michael C. Keeling, Tempe; Dwight E. Doss, Phoenix, both of Ariz.

[73] Assignee: Motorola, Inc., Schaumburg, Ill.

[21] Appl. No.: 865,038

[22] Filed: Dec. 27, 1977

[51] Int. Cl.² .................................................. F24J 3/02
[52] U.S. Cl. ................................ 156/245; 126/271.1; 136/89 EP; 237/1 A
[58] Field of Search .......................... 156/245, 99, 107; 136/89 H; 174/DIG. 8, 50.5, 52 PE, 52 S; 126/271; 237/1 A; 29/588; 264/272, 275, 278, 279

[56] References Cited

U.S. PATENT DOCUMENTS

| | | | |
|---|---|---|---|
| 2,222,788 | 11/1940 | Touceds et al. | 174/52 PE |
| 2,974,823 | 8/1976 | Patil | 52/172 |
| 3,084,391 | 4/1963 | Parstorfer | 174/52 PE |
| 3,584,106 | 6/1971 | Miller | 174/52 PE |
| 3,918,430 | 11/1975 | Stout et al. | 126/271 |
| 3,972,317 | 8/1976 | Gallagher | 237/1 A |
| 3,974,822 | 8/1976 | Patil | 52/172 |
| 3,980,071 | 9/1976 | Barber | 237/1 A |
| 3,981,293 | 9/1976 | Gillen | 126/271 |

Primary Examiner—Caleb Weston
Attorney, Agent, or Firm—John A. Fisher

[57] ABSTRACT

An enclosure for a solar cell array and a method of fabricating a solar cell module. The array is enclosed between a metal back plate and a cover glass. The edges of the enclosure are sealed by a pliable sealant material and a spring loaded bezel that is riveted or welded in place. The interior of the enclosure is filled with a potting material which surrounds and cushions the solar cell array. During the module fabrication a fixture supports the enclosure parts and provides a temporary edge seal to facilitate the potting procedure. Controlled flexure of the enclosure back plate and controlled spacing of the cover glass ensure a compressive loading of the potting material which eliminates possible delamination of the potting material in its subsequent usage.

5 Claims, 4 Drawing Figures

METHOD FOR ENCAPSULATING A SOLAR CELL ARRAY

BACKGROUND OF THE INVENTION

This invention relates to the encapsulation of solar cell arrays and more particularly to a solar cell enclosure and an improved method for encapsulating a solar cell array within that enclosure.

Solar cells or photovoltaic devices are becoming of increasing importance in the generation of electrical power. Individual solar cells are connected in various series/parallel combinations to provide arrays having several output voltage and current options. A module is then fabricated by enclosing a solar cell array between a supportive backplate and an optically transparent glass front plate. The volume between the back and front plates and surrounding the solar cell array is filled with a potting material. A seal between the front and back plates cooperates with the potting material to provide a long-term moisture and contamination barrier. The potting material provides a hydrodynamic cushion for the glass cover plate and provides an adhesive seal with the glass plate, the solar cell array, and the electrical interconnection to the array. The potting material must provide a highly transmissive path for visible light, and a low permeability to typical atmosphere contaminates. It must be dimensionally stable, have a low shear strength, be of high thermal conductivity, and high electrical resistivity. Silicone based polymers that cure into a solid elastomer are often used for the potting material. An alternative which exhibits the desirable properties is the partial crosslinking of silicone monomers such as those utilized in commercial silicone oils. This forms a gel-like material that exhibits excellent cohesive and adhesive strengths. The uncured silicone gel has a consistency similar to that of a medium weight motor oil, and this results in handling problems concerning the containment within the enclosure prior to complete cure. Heretofor, there has not been an effective procedure for potting and enclosing solar cell arrays. Accordingly, it is an object of this invention to provide a solar cell enclosure having a compatible seal design. It is a further object of this invention to provide a solar cell enclosure which has provisions for repairability. It is a still further object of this invention to provide a method for enclosing solar cell arrays. Such a method provides for temporarily sealing the edges of the enclosure during the potting (curing) procedure. The process provides a positive pressurization of the enclosure during the potting process by the hydrostatic pressure of the potting material or by pressurized feeding of the gel into the enclosure cavity. The process further provides the flexibility of adding a second sealant around the panel perimeter prior to the attachment of a spring loaded metal bezel. Still further, the process permits the attainment of less voids in the potting material and imparts a compressive loading on the potting material which in turn minimizes the tendency of the potting material to separate or delaminate from the glass, back plate, or the array surfaces. The enclosure and method provide a highly transmissive, highly adhesive optical coupling of the solar cells to the panel exterior.

SUMMARY OF THE INVENTION

In accordance with the invention a solar cell enclosure and a method for assembling a solar cell module are provided. The solar cell module is comprised of an array of interconnected solar cells sandwiched between a metal pan backing and a glass cover. The interior of the enclosure is filled with a silicone gel which surrounds the solar cell array and, in the final structure, the edges of the metal pan and glass cover are sealed together and held with a metal bezel.

In fabricating the module, the metal pan backing is placed on an assembly fixture. The solar cell array is then placed on the pan and covered with a front glass plate. Spacers are inserted between the metal pan and the cover glass to provide a specified amount of separation. The fixture holds the glass plate rigidly in place and also provides a temporary seal around the edges of the enclosure. This temporary seal is provided with a filling port through which potting material can be poured, and a vent port through which air can escape from the enclosure. The fixture is shaped to permit a desired amount of flexure of the pan as the enclosure is filled with the potting material. As the enclosure is filled with potting material, the fixture and the enclosure can be vibrated and subjected to a vacuum to ensure that the potting material entirely fills the interior volume of the enclosure, leaving no air filled voids. When the enclosure has been satisfactorily filled with potting material, the assembly is placed in an oven to cure the potting material. Following the curing of the potting material, the supporting fixture can be removed and a permanent seal affixed around the edges of the enclosure. This seal consists of a pliable sealant material and a spring loaded bezel welded or riveted to the metal pan. The metal bezel is so configured that it confines the sealant material without rigidly constraining the glass cover, thus allowing for thermal expansion. If a failure occurs that is internal to the solar cell module, the rivets or spot welds which fasten the bezel to the pan can be removed, the bezel pushed off, and the enclosure opened for repair.

BRIEF DESCRIPTION OF THE DRAWINGS

Other objects and advantages of the invention will become apparent upon reading the following detailed description and upon reference to the drawings, in which.

While the invention will be described in connection with a preferred embodiment, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

Figure 1:
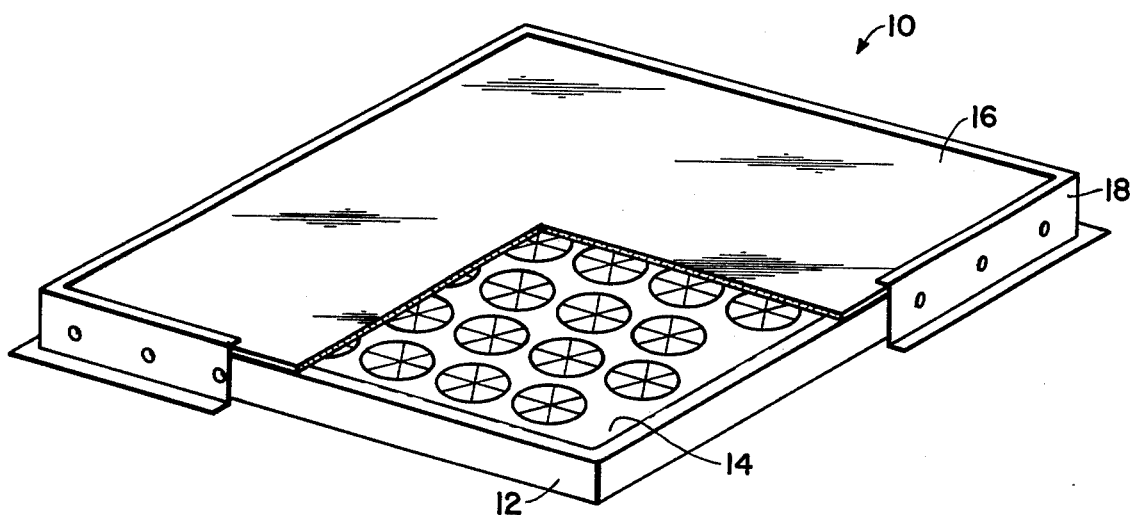
FIG. 1 is a partially cut-away perspective view of a finished solar cell module.

Turning first to FIG. 1, there is shown a completed solar cell module 10. The module 10 is comprised of a back plate 12, the solar cell array 14, and the cover glass 16. The edges of the enclosure are sealed by a bezel 18 which is riveted or spot welded to the back plate 12.

The total interior volume of the enclosure is filled with a potting material which completely surrounds the solar cell array.

Figure 2:
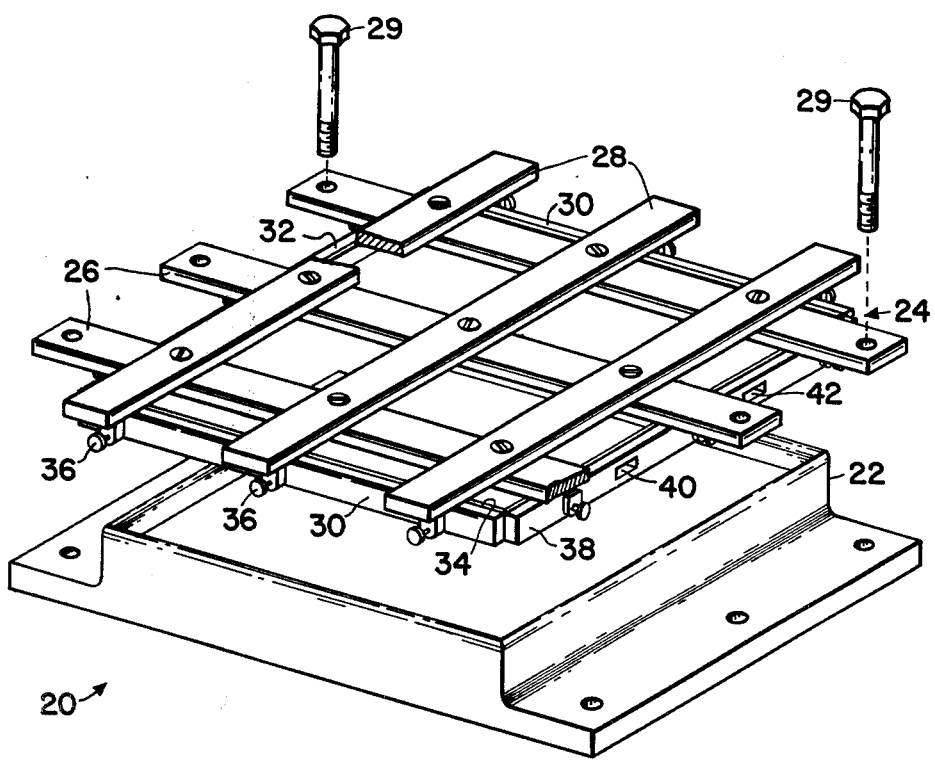
FIG. 2 schematically shows a fixture used in the assembly of a solar cell module.

FIG. 2 shows a fixture 20 which is used in assembling the solar cell module in accordance with the invention. The fixture 20 has a pan support 22 and a glass support 24. The pan support 22 is shaped to receive the back plate or pan 12 of the solar cell module. The surface of the pan support 22 is contoured slightly to allow the back plate 12 to flex outwardly by about 120 mils at its center when the enclosure is filled with potting material. The fixture then rigidly supports the pan in this position. The flexing results from the hydrostatic pressure or weight of the potting material itself. The pan support 22 can be, for example, molded from fiberglass to the desired shape. The glass support 24 can be a rigid framework of ribs 26 bolted to and held in position by cross pieces 28. The glass support 24, which might be made from quarter-inch thick aluminum or other rigid material, can be fastened at its edges to the pan support 22 by bolts 29. Attached to the glass support 24 are side compression bars 30 and a bottom compression bar 32. The compression bars 30, 32 are rigid aluminum pieces faced with a deformable sealing material 34 such as soft sponge rubber. Compression screws 36 allow the compression bars to be pulled up snugly against the edges of the solar cell assembly to provide a temporary edge seal. A similarly constructed compression bar 38 is provided at the top of the glass support 24. Compression bar 38, however, has openings 40, 42 through the aluminum and sponge rubber for filling the enclosure with potting material and for venting the air from within the enclosure, respectively.

Figure 3:
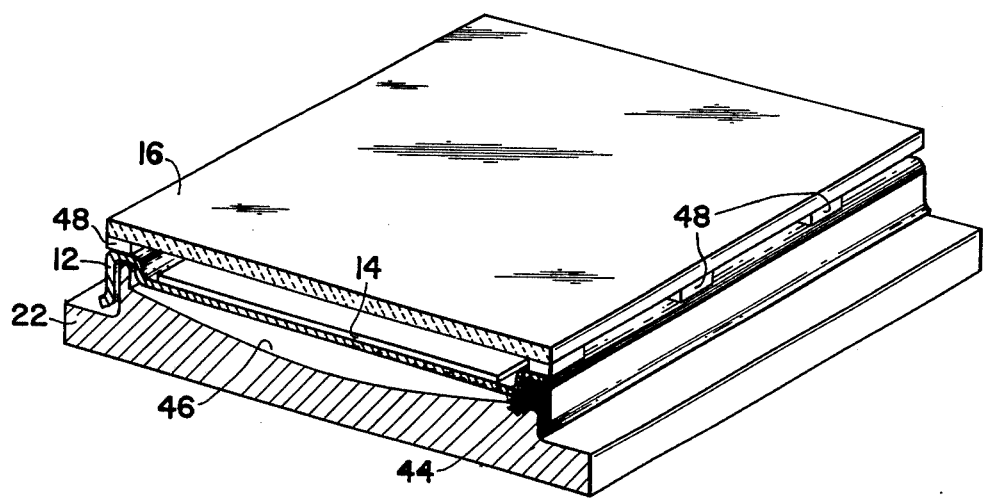
FIG. 3 schematically shows in perspective a partially assembled module.

In fabricating a solar cell module 10, the backplate or pan 12 is placed in position on the pan support 22. The backplate 12 can be formed from stainless steel of about 10 mils thickness. The stainless steel provides strength, good thermal conduction, corrosion resistance, and is readily formable in the desired shape. Alternatively, the pan 12 could be formed, for example, from aluminum or from some high temperature, thermally conductive plastic. The interconnected array of solar cells 14 is placed on the backplate and then is covered with a cover glass 16. The glass can be about one-eighth inch in thickness and should have a low iron and iron oxide content to insure high transparency in the solar spectrum. FIG. 3 schematically depicts the spatial relationship between the parts so far assembled. The shaping of the stainless steel pan 12 with its edge lip 44 establishes the correct spacing between the pan, array, and glass. The contoured surface 46 of the pan support 22 is exaggerated in this Figure for illustrative purposes. Spacers 48 are positioned about the perimeter of the pan 12 so as to provide a controlled spacing between the pan 12 and the cover glass 16. These spacers 48 can be made of a plastic material and can be about 6 mils in thickness. The glass support 24 is now placed on top of the glass cover 16 and is bolted in place. The bolts push the ribs 26 firmly against the cover glass. Thus the pan support 22 and the glass support 24 push the cover glass 16 against the pan lip 44. The pan and glass are therefore separated only by the spacers 48. The side compression bars 30 and the bottom compression bar 32 are then pulled up against the edge of the glass and pan by the compression screws 36 to affect a temporary seal around three edges of the enclosure. The fourth compression bar 38 can then be screwed in place to seal the remaining edge of the enclosure except for the filler opening 40 and vent opening 42. The enclosure is now ready to be filled with a potting material. A number of potting materials could be used; one that has been found to be particularly appropriate is a partially cross-linked silicone oil such as DC-Q3-6527, which is manufactured by the Dow Corning Corporation. The potting material is poured through the filler hole 40 with the displaced air escaping through vent hole 42. As the enclosure is filled, the hydrostatic pressure of the potting material pushes against the metal pan 12 flexing the pan outwardly against the contoured surface 46 of the pan support 22. To facilitate the total filling of the interior of the enclosure and the elimination of voids or bubbles within the potting material, the enclosure and fixture can be placed in a vacuum chamber. The vacuum chamber (not shown) need only be a simple box large enough to accommodate the fixture. It can be evacuated with a simple mechanical roughing pump. Repeatedly evacuating the vacuum chamber, and adding more potting material to the enclosure, as necessary, ensures the void-free filling of the module 10. Eliminating voids is necessary to provide a high integrity contamination barrier and to provide a good optical path. The elimination of voids can also be facilitated by vibrating or shaking the enclosure and fixture assembly. The potting material can then be cured. This is done, for example, with the particular cross-linked silicone oil by heating to approximately 75° C. for about four hours. Such a curing operation causes the potting material to become gel-like.

Figure 4:
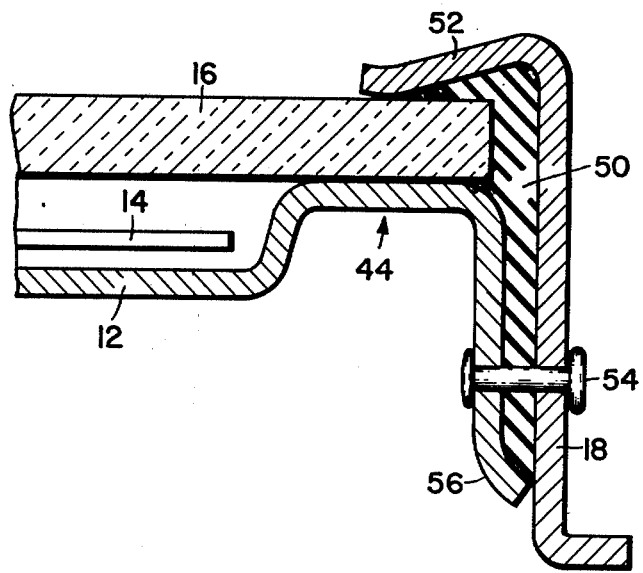
FIG. 4 shows in cross-section the details of the enclosure edge seal.

After the potting material has cured, the potting fixture assembly 20 can be removed since it has now completed its function. The spacers 48 are also removed, and the glass cover 16 and the lip 44 of the backplate 12 are pulled together. This step enhances the positive pressurization of the enclosure and imparts a compressive loading on the potting material. This in turn minimizes the tendency of the potting material to separate from the glass, the metal, or the solar cell array. It also decreases the available expansion volume and thus lessens the probability of delamination. FIG. 4 shows the details of the permanent edge seal that now completes the solar cell module. The pan lip 44 is shown to be in intimate contact with the cover glass 16. A formed-in-place gasket material 50 is spread around the edge of the module. This can be, for example, a pliable polysulfide gasket material. Over this the bezel 18 is placed. The bezel 18 can be stainless steel or other rigid material. The top of the bezel 52 is so shaped as to provide a spring loaded action in contact with a cover glass 16. The bezel thus confines the sealant material 50 and holds the cover glass 16 in place without rigidly constraining the glass 16, thus allowing for thermal expansion. The bezel 18 is pushed into place, flexing top portion 52 against the cover glass 16 and then is riveted or spot welded to the backplate 12. Should a failure ever occur within the module, the rivets 54 could be removed to facilitate disassembly and repair of the module. Another element of the edge seal is provided by the shaping of the extreme edge 56 of the backplate 12. The edge 56 is shaped to form a second spring loading action against the bezel 18 as the bezel is riveted in place. Thus a combination of elements provides a long-term moisture/contamination barrier of a disturbed nature. This consists of the spring loading of the pan to bezel contact, the formed-in-place gasket 50, the spring loading of the metal 52 to glass 16 seal, and finally the barrier provided by the internal potting material itself.

Thus, it is apparent that there has been provided, in accordance with the invention, a solar cell enclosure and a method for fabricating a solar cell module that fully satisfies the objects and advantages set forth above. While the invention hase been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A process for encapsulating a solar cell module comprising:
    placing an array of interconnected solar cells between a back plate adapted to receive said array and a cover glass;
    positioning said back plate and said cover glass a predetermined distance apart;
    providing a temporary edge seal between said back plate and said cover glass;
    filling the enclosure thus formed with a potting material; curing said potting material;
    removing said temporary edge seal;
    contacting said back plate and said cover glass; and
    affixing a permanent seal securing said back plate and said cover glass.

2. A process for encapsulating a solar cell module comprising the steps of:
    placing an array of interconnected solar cells between a back plate and a cover glass;
    supporting said back plate on a rigid first fixture portion;
    holding said cover glass in position with a second fixture portion attachable to said first fixture portion;
    inserting spacers between said back plate and said cover glass;
    providing a temporary seal about the edge of said back plate and said cover glass;
    filling the volume enclosed by said back plate, said cover glass and said temporary seal with a potting material;
    curing said potting material;
    removing said temporary seal;
    removing said spacers and pulling said cover glass into contact with said back plate to compressibly load said potting material; and
    affixing a permanent seal about the edges of said back plate and said cover glass.

3. The process of claim 2 further comprising the steps of: contouring the surface of said first fixture portion; flexing said back plate against said contoured surface as the enclosure is filled with potting material; and supporting said back plate in said flexed condition.

4. The process of claim 2 wherein said temporary seal is provided by pulling compression bars faced with deformable sealing material against the edges of said back plate and said cover glass by compression screws.

5. The process of claim 4 wherein said volume is filled with potting material by pouring said potting material through an opening provided in one of said compression bars.

* * * * *